United States Patent
Kurashima

(10) Patent No.: US 11,143,461 B2
(45) Date of Patent: Oct. 12, 2021

(54) FLAT LOOP HEAT PIPE

(71) Applicant: Shinko Electric Industries Co., LTD., Nagano-Ken (JP)

(72) Inventor: Nobuyuki Kurashima, Nagano (JP)

(73) Assignee: Shinko Electric Industries Co., LTD., Nagano-ken (JP)

(*) Notice: Subject to any disclaimer, the term of this patent is extended or adjusted under 35 U.S.C. 154(b) by 14 days.

(21) Appl. No.: 16/277,855

(22) Filed: Feb. 15, 2019

(65) Prior Publication Data
US 2019/0264989 A1 Aug. 29, 2019

(30) Foreign Application Priority Data
Feb. 27, 2018 (JP) .................. 2018-033585

(51) Int. Cl.
| | | |
|---|---|---|
| *F28D 15/04* | (2006.01) | |
| *F28F 3/08* | (2006.01) | |
| *F28D 15/02* | (2006.01) | |
| *F28F 3/12* | (2006.01) | |
| *G06F 1/20* | (2006.01) | |
| *H01L 23/427* | (2006.01) | |

(52) U.S. Cl.
CPC ....... *F28D 15/043* (2013.01); *F28D 15/0233* (2013.01); *F28F 3/08* (2013.01); *F28F 3/086* (2013.01); *F28F 3/12* (2013.01); *G06F 1/203* (2013.01); *H01L 23/427* (2013.01)

(58) Field of Classification Search
CPC .. F28D 15/043; F28D 15/0233; F28D 15/046; F28D 15/0266; F28F 3/08; F28F 3/086; F28F 3/12; G06F 1/203; H01L 23/427
See application file for complete search history.

(56) References Cited

U.S. PATENT DOCUMENTS

| | | | |
|---|---|---|---|
| 6,227,288 B1 | 5/2001 | Gluck et al. | |
| 6,863,117 B2* | 3/2005 | Valenzuela | F28D 15/0233 165/104.21 |
| 6,880,625 B2* | 4/2005 | Choi | F28D 15/043 165/104.21 |

(Continued)

FOREIGN PATENT DOCUMENTS

| | | |
|---|---|---|
| EP | 2 876 678 A1 | 5/2015 |
| JP | 2002-022381 A | 1/2002 |

(Continued)

OTHER PUBLICATIONS

Extended European Search Report for Application No. EP 19158948.0 dated Jul. 25, 2019.

*Primary Examiner* — Gordon A Jones
(74) *Attorney, Agent, or Firm* — Wolf, Greenfield & Sacks, P.C.

(57) ABSTRACT

A flat loop heat pipe includes an evaporator that vaporizes a working fluid, a condenser that liquefies the working fluid vaporized by the evaporator, a vapor pipe that connects the evaporator to the condenser, and a liquid pipe that connects the condenser to the evaporator. The liquid pipe includes a first wick. The condenser includes a flow passage and a second wick. The flow passage connects the vapor pipe and the liquid pipe. The second wick is connected to the first wick. The second wick is exposed in the flow passage and extends from the flow passage in a planar direction.

6 Claims, 6 Drawing Sheets

(56) References Cited

U.S. PATENT DOCUMENTS

| | | | |
|---|---|---|---|
| 7,007,746 B2* | 3/2006 | Wu | F28D 15/043 |
| | | | 165/104.26 |
| 2006/0157227 A1* | 7/2006 | Choi | H01L 23/427 |
| | | | 165/104.21 |
| 2006/0272798 A1 | 12/2006 | Liu et al. | |
| 2010/0044014 A1* | 2/2010 | Ho | F28D 1/035 |
| | | | 165/104.26 |
| 2015/0138830 A1 | 5/2015 | Yu | |
| 2015/0176918 A1* | 6/2015 | Pai | F28D 15/0233 |
| | | | 165/104.26 |
| 2015/0221579 A1 | 8/2015 | Iwata et al. | |
| 2015/0305199 A1 | 10/2015 | Yu | |
| 2016/0259383 A1 | 9/2016 | Shioga et al. | |
| 2018/0177077 A1* | 6/2018 | Shioga | H05K 7/20327 |
| 2019/0075682 A1* | 3/2019 | Shioga | F28D 15/02 |

FOREIGN PATENT DOCUMENTS

| | | |
|---|---|---|
| JP | 2002-327993 A | 11/2002 |
| WO | WO 2015/087451 A1 | 6/2015 |

* cited by examiner

FLAT LOOP HEAT PIPE

CROSS-REFERENCE TO RELATED APPLICATIONS

This application is based upon and claims the benefit of priority from prior Japanese Patent Application No. 2018-033585, filed on Feb. 27, 2018, the entire contents of which are incorporated herein by reference.

FIELD

This disclosure relates to a flat loop heat pipe.

BACKGROUND

A heat pipe is a device that uses phase transition of a working fluid to cool heat-generating components of a semiconductor device (e.g., central processing unit (CPU)) mounted on an electronic device (refer to International Patent Publication No. 2015/087451 and Japanese Laid-Open Patent Publication No. 2002-22381).

SUMMARY

A heat pipe includes a flow passage through which a working fluid flows, an evaporator (i.e. heat generator) fixed to a heat-generating component of an electronic device, and a condenser (i.e., heat dissipater) connected to the evaporator via the flow passage. When mounting a heat pipe on an electronic device, the evaporator and the condenser may not be located on the same plane. In such a case, the heat pipe needs to be bent. However, such bending may narrow or close the flow passage of the working fluid and hinder a smooth flow of the working fluid. When the flow of the working fluid is hindered in such a manner, the heat pipe may fail to function properly.

One embodiment of a flat loop heat pipe includes an evaporator that vaporizes a working fluid, a condenser that liquefies the working fluid vaporized by the evaporator, a vapor pipe that connects the evaporator to the condenser, and a liquid pipe that connects the condenser to the evaporator and includes a first wick. The condenser includes a flow passage and a second wick. The flow passage connects the vapor pipe and the liquid pipe. The second wick is exposed in the flow passage and extends from the flow passage in a planar direction of the flat loop heat pipe. The second wick is connected to the first wick.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
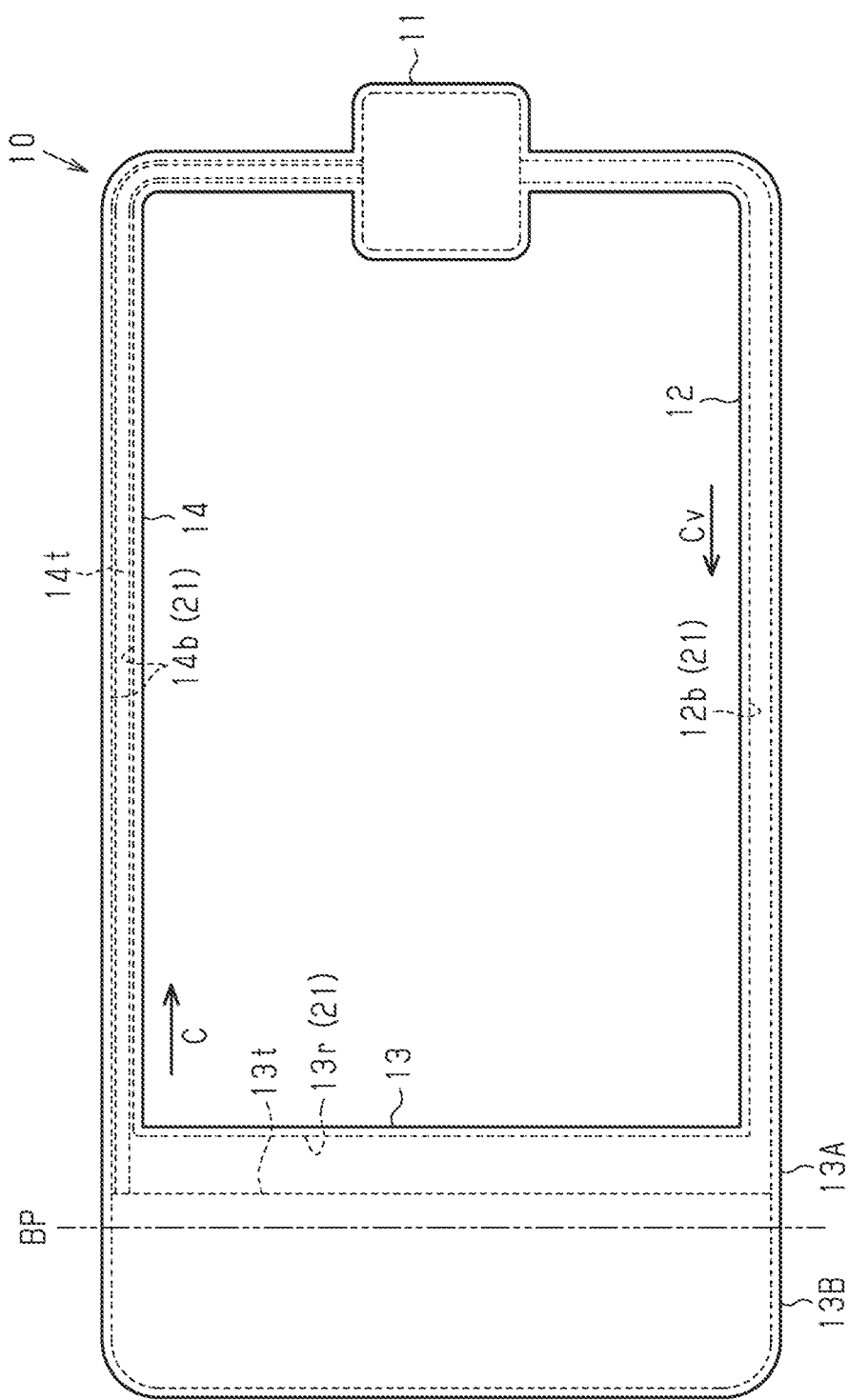
FIG. 1 is a schematic plan view of a flat loop heat pipe according to an exemplary embodiment.

Embodiments will now be described with reference to the drawings. In the drawings, elements are illustrated for simplicity and clarity and have not necessarily been drawn to scale. To facilitate understanding, hatching patterns may not be illustrated in the plan views and the cross-sectional views.

Figure 2:
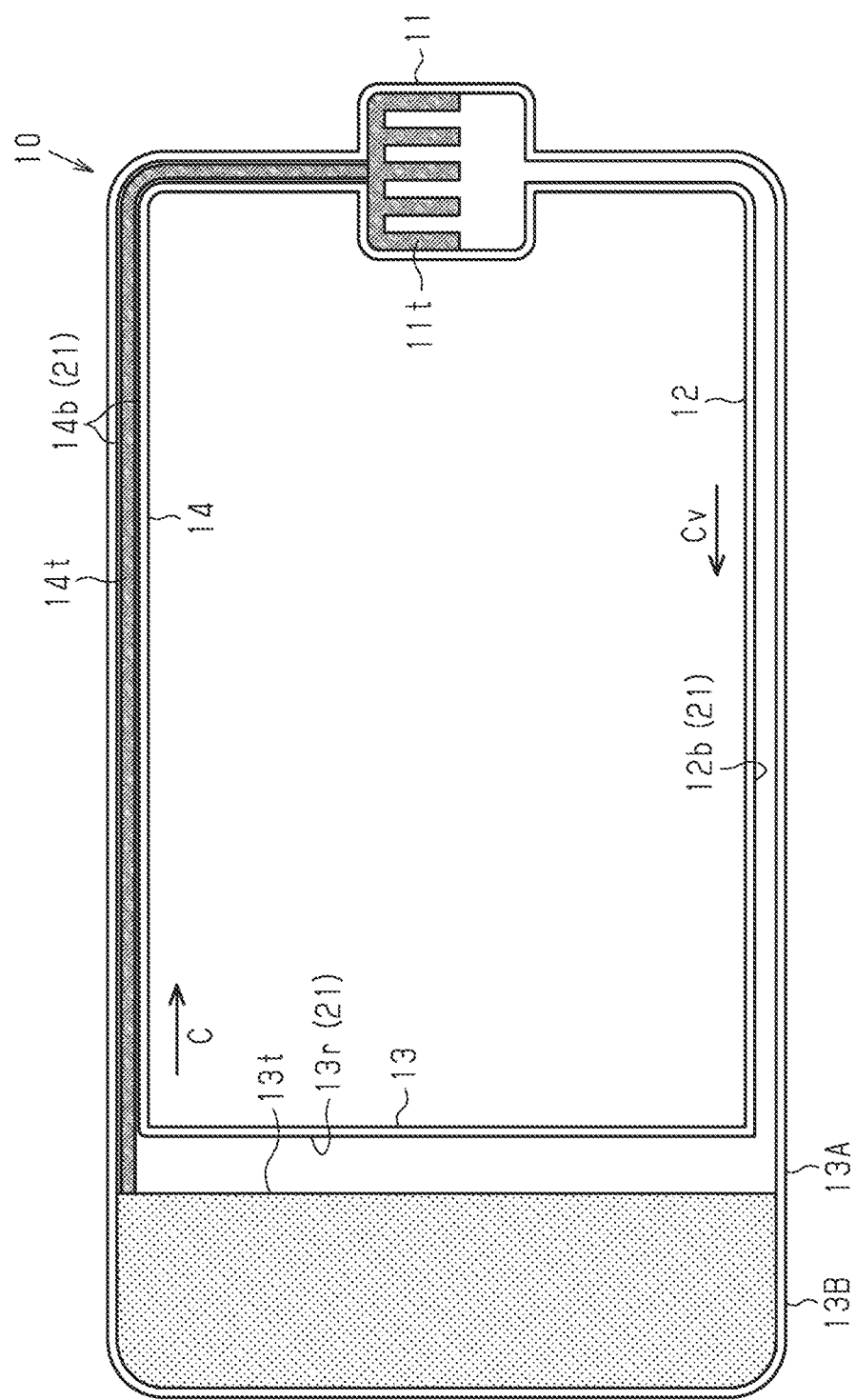
FIG. 2 is a schematic plan view of a flat loop heat pipe from which the uppermost metal layer is removed.

As illustrated in FIGS. 1 and 2, a flat loop heat pipe 10 includes an evaporator 11, a vapor pipe 12, a condenser 13, and a liquid pipe 14. The evaporator 11 functions to vaporize a working fluid C and generate a vapor Cv. The condenser 13 functions to liquefy the vapor Cv, which is the vaporized working fluid C, and generate the working fluid C. The vapor pipe 12 connects the evaporator 11 to the condenser 13. The liquid pipe 14 connects the condenser 13 to the evaporator 11. The liquid pipe 14 includes a wick 14t. The wick 14t extends along the liquid pipe 14 from the condenser 13 to the proximity of the evaporator 11. The wick 14t is a capillary structural body, which produces capillary force on the working fluid C. The liquefied working fluid C is moved from the condenser 13 to the evaporator 11 by the capillary force of the wick 14t. The vapor pipe 12 and the liquid pipe 14 form looped flow passages 21, through which the working fluid C and the vapor Cv flow, together with the evaporator 11 and the condenser 13. In the present embodiment, the liquid pipe 14 and the vapor pipe 12 have the same length. However, the liquid pipe 14 and the vapor pipe 12 may have different lengths. For example, the vapor pipe 12 may be shorter than the liquid pipe 14.

The evaporator 11 includes a wick 1it. The wick 1it is a capillary structural body, which produces capillary force on the working fluid C. Preferably, the wick 1it is configured to produce a greater capillary force than the wick 14t.

The condenser 13 includes a flow passage portion 13A and a wick portion 13B. The flow passage portion 13A includes a flow passage 13r connecting the vapor pipe 12 and the liquid pipe 14. The flow passage 13r forms the looped flow passages 21, through which the working fluid C and the vapor Cv flow, together with the vapor pipe 12 and the liquid pipe 14.

The wick portion 13B includes a wick 13t. The wick 13t is connected to the flow passage 13r and extends from the flow passage 13r in a planar direction (leftward in FIGS. 1 and 2) of the flat loop heat pipe 10. The wick 13t is a capillary structural body, which produces capillary force on the working fluid C. The wick 13t of the wick portion 13B is connected to the wick 14*t* of the liquid pipe 14. In the present embodiment, the wick 14*t* of the liquid pipe 14 extends from the liquid pipe 14 into the condenser 13 and is connected to the wick 13*t* of the condenser 13. The wick 13*t* of the condenser 13 and the wick 14*t* of the liquid pipe 14 each produce capillary force and move the working fluid C. Thus, the working fluid C moves from the wick 13*t* of the condenser 13 to the wick 14*t* of the liquid pipe 14.

In the present embodiment, the wick 14*t* of the liquid pipe 14 is configured to produce a greater capillary force on the liquefied working fluid C than the wick 13*t* of the condenser 13. In other words, the capillary force of the wick 13*t* of the condenser 13 is weaker than the capillary force of the wick 14*t* of the liquid pipe 14. This further smoothly moves the working fluid C liquefied by the condenser 13 toward the wick 14*t* of the liquid pipe 14.

Figure 6:
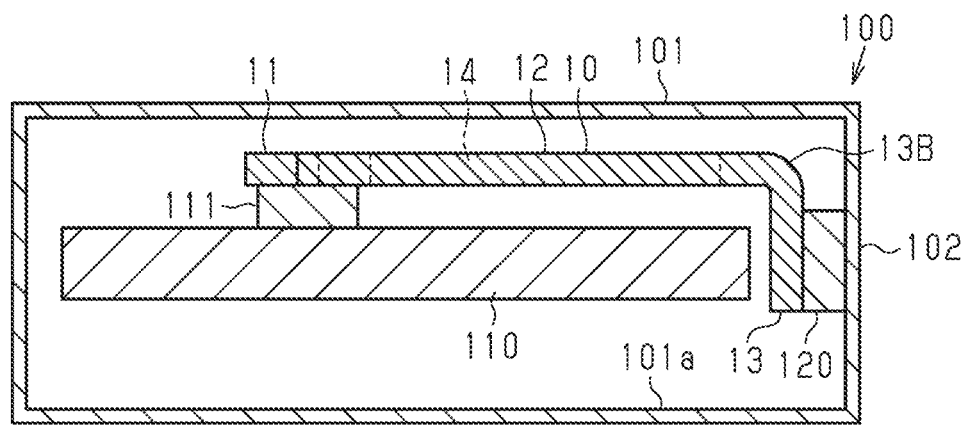
FIG. 6 is a schematic cross-sectional view of an electronic device including a flat loop heat pipe.

As illustrated in FIG. 6, the evaporator 11 is fixed to a heat-generating component 111 in close contact with the heat-generating component 111. Heat generated in the heat-generating component 111 vaporizes the working fluid C in the evaporator 11 and generates the vapor Cv. A thermal interface material (TIM) may be arranged between the evaporator 11 and the heat-generating component 111. The thermal interface material reduces a thermal contact resistance between the heat-generating component 111 and the evaporator 11 and smoothly transfers heat from the heat-generating component 111 to the evaporator 11. The vapor Cv generated by the evaporator 11 is guided via the vapor pipe 12 toward the condenser 13 and liquefied by the condenser 13. The working fluid C liquefied by the condenser 13 is guided via the liquid pipe 14 toward the evaporator 11.

As described above, the flat loop heat pipe 10 transfers heat generated in the heat-generating component 111 to the condenser 13 and dissipates the heat from the condenser 13. As a result, the heat-generating component 111 is cooled by the flat loop heat pipe 10.

Preferably, a fluid having a high vapor pressure and a high latent heat of vaporization is used as the working fluid C. With the use of such a working fluid C, the heat-generating component 111 is efficiently cooled by the latent heat of vaporization. Examples of the working fluid C include ammonia, water, chlorofluorocarbon, alcohol, and acetone.

The flat loop heat pipe 10 may include, for example, a metal layer stack of metal layers. The metal layers are, for example, copper layers having superior thermal conductance and directly bonded with each other through solid-phase bonding or the like. The thickness of each metal layer may be, for example, approximately 50 μm to 200 μm. The metal layer is not limited to a copper layer and may be a stainless layer, an aluminum layer, a magnesium alloy layer, or the like. The number of stacked metal layers is not particularly limited. One or more of the metal layers in the metal layer stack may be formed from a material differing from the material of the other metal layers.

The flat loop heat pipe 10 is, for example, bent at a position BP indicated by the double-dashed line in FIG. 1. In the flat loop heat pipe 10 of the present embodiment, the bending position BP is set to the condenser 13 (position of the wick 13*t*).

Figure 4:
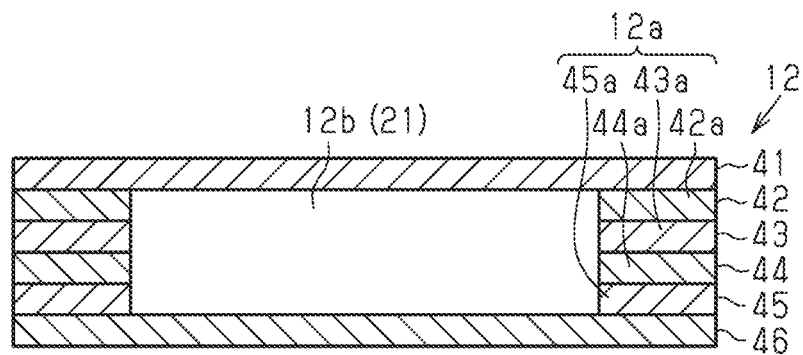
FIG. 4 is a schematic cross-sectional view of a vapor pipe.

As illustrated in FIG. 4, the vapor pipe 12 is, for example, formed by a metal layer stack in which metal layers 41 to 46 are sequentially stacked. In the description hereafter, the metal layer 41 may be referred to as the outermost metal layer 41 (or uppermost metal layer 41), the metal layer 46 may be referred to as the outermost metal layer 46 (or lowermost metal layer 46), and the metal layers 42 to 45 may be referred to as the intermediate metal layers 42 to 45. When there is no need to distinguish the outermost metal layer and the intermediate metal layers, the layers may be simply referred to as the metal layers 41 to 46. In FIG. 4, to facilitate understanding, the metal layers 41 to 46 are separated by solid lines and indicated by different hatchings. However, for example, when the metal layers 41 to 46 are integrated through diffusion bonding, the interfaces between the metal layers 41 to 46 may be eliminated, and boundaries between the metal layers 41 to 46 may be unclear.

The outermost metal layers 41 and 46 are located at the outermost sides of the metal layer stack including the metal layers 41 to 46. The intermediate metal layers 42 to 45 are located between the outermost metal layer 41 and the outermost metal layer 46. In the present example, the flat loop heat pipe 10 including the vapor pipe 12 includes the two outermost metal layers 41 and 46 and the intermediate metal layers 42 to 45 stacked between the two outermost metal layers 41 and 46. The outermost metal layers 41 and 46 are solid metal layers that are free of holes and grooves. The intermediate metal layers 42 to 45 respectively include walls 42*a*, 43*a*, 44*a*, and 45*a* arranged at opposite sides of the vapor pipe 12. The walls 42*a* to 45*a* form pipe walls 12*a* of the vapor pipe 12.

Figure 5:
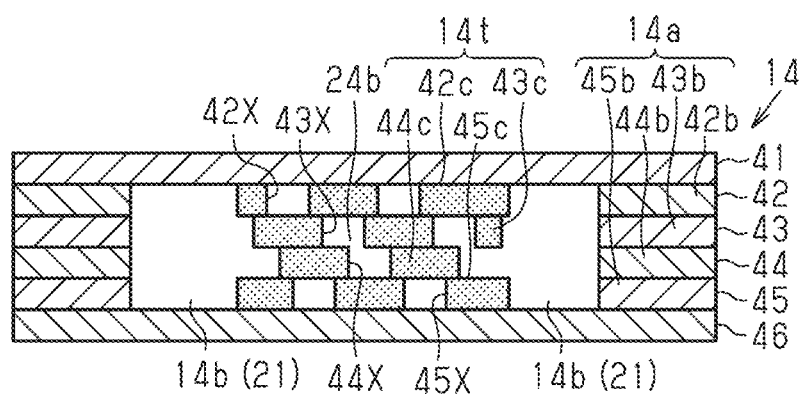
FIG. 5 is a schematic cross-sectional view of a liquid pipe.

As illustrated in FIG. 5, in the same manner as the vapor pipe 12, the liquid pipe 14 is formed by a metal layer stack including the metal layers 41 to 46. The wick 14*t* of the liquid pipe 14 is formed, for example, by the intermediate metal layers 42 to 45, which exclude the uppermost metal layer 41 and the lowermost metal layer 46. In FIG. 5, the portion corresponding to the wick 14*t* formed by the intermediate metal layers 42 to 45 is indicated by dot hatching. In the same manner as in FIG. 4, in FIG. 5, the metal layers 41 to 46 are separated by solid lines to facilitate understanding. However, as described above, for example, when the metal layers 41 to 46 are integrated through diffusion bonding, the interfaces between the metal layers 41 to 46 may be eliminated, and the boundaries between the metal layers 41 to 46 may be unclear.

The intermediate metal layers 42 to 45 respectively include walls 42*b*, 43*b*, 44*b*, and 45*b* located at opposite sides of the liquid pipe 14. The walls 42*b* to 45*b* form pipe walls 14*a* of the liquid pipe 14. Further, the intermediate metal layers 42 to 45 respectively include wick forming portions 42*c* to 45*c* located between the two pipe walls 14*a*. The wick forming portions 42*c* to 45*c* form the wick 14*t* of the liquid pipe 14. The wick forming portion 42*c* includes through holes 42X extending through the intermediate metal layer 42 in the thickness-wise direction. In the same manner, the wick forming portion 43*c* includes through holes 43X extending through the intermediate metal layer 43, the wick forming portion 44*c* includes through holes 44X extending through the intermediate metal layer 44, and the wick forming portion 45*c* includes through holes 45X extending through the intermediate metal layer 45. Thus, the wick 14*t* includes the through holes 42X to 45X. Each of the through holes 42X to 45X is, for example, circular. The through holes 42X to 45X are arranged to partially overlap one or more of the through holes 42X to 45X of the metal layers 42 to 45 that are in contact in the vertical direction. For example, each through hole 42X in the metal layer 42 partially overlaps one or more of the through holes 43X in the metal layer 43. Each through hole 43X in the metal layer 43 partially overlaps one or more of the through holes 44X in the metal layer 44. The metal layer 45 is configured in the same manner. The through holes 42X to 45X form a fine flow passage 24*b* that allows the working fluid C to flow through the through holes 42X to 45X. The flow passage 24*b* produces capillary force so that the working fluid C readily flows through the liquid pipe 14. In the present embodiment, the wick 14*t* is spaced apart from the two pipe walls 14*a* of the liquid pipe 14. Thus, the liquid pipe 14 includes two flow passages 14*b* forming the looped flow passages 21 between the wick 14*t* and each of the two pipe walls 14*a*. The flow passages 14*b* allow the working fluid C to readily flow through the liquid pipe 14.

Figure 3A:
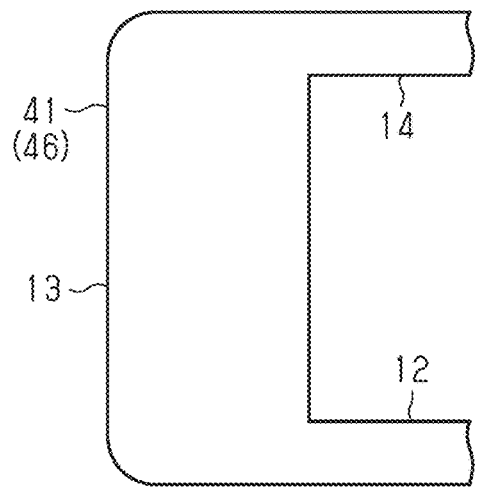
FIG. 3A is a schematic plan view illustrating a portion of the outermost metal layer forming a condenser.
Figure 3B:
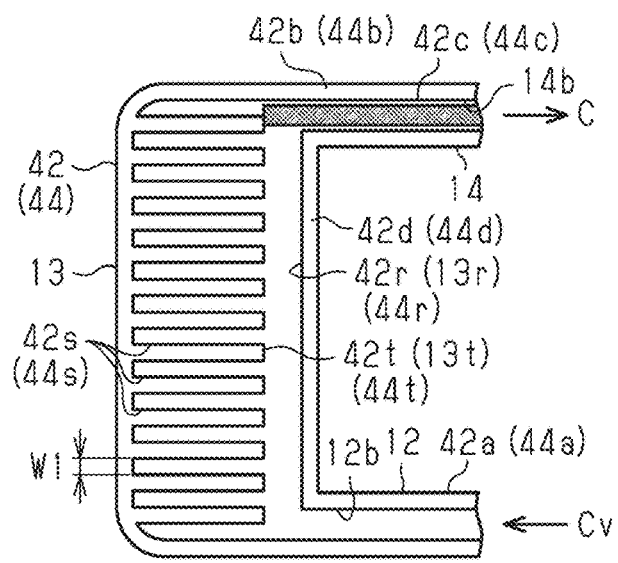
FIG. 3B is a schematic plan view illustrating a portion of an intermediate metal layer forming the condenser.
Figure 3C:
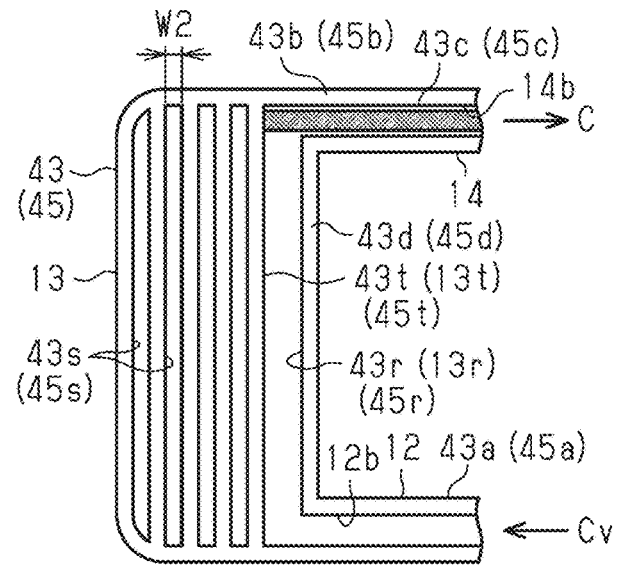
FIG. 3C is a schematic plan view illustrating a portion of another intermediate metal layer forming the condenser.

FIGS. 3A to 3C illustrate one example of the metal layers 41 to 46 of the flat loop heat pipe 10. In the present embodiment, the outermost metal layer 46 and the outermost metal layer 41 have the same shape. The intermediate metal layer 44 and the intermediate metal layer 42 have the same shape. The intermediate metal layer 45 and the intermediate metal layer 43 have the same shape. Thus, FIGS. 3A to 3C illustrate the configurations of the metal layers 46, 44, and 45 in parentheses.

FIG. 3A illustrates a portion of the outermost metal layer 41. The outermost metal layer 41 is free of grooves and through holes. As described above, the outermost metal layer 46 and the outermost metal layer 41 have the same shape.

FIG. 3B illustrates a portion of the intermediate metal layer 42. The intermediate metal layer 42 includes a flow passage 12*b* at a position corresponding to the vapor pipe 12. The flow passage 12*b* of the intermediate metal layer 42 is defined by the two walls 42*a*. The intermediate metal layer 42 further includes a wick forming portion 42*t* and a flow passage 42*r* at a portion corresponding to the condenser 13. The wick forming portion 42*t* forms the wick 13*t*, and the flow passage 42*r* forms the flow passage 13*r*. The flow passage 42*r* is defined by the wick forming portion 42*t* and a wall 42*d*. The intermediate metal layer 42 further includes the wick forming portion 42*c* and the two flow passages 14*b* at a portion corresponding to the liquid pipe 14. The wick forming portion 42*c* forms the wick 14*t* (refer to FIG. 2). The flow passages 14*b* of the intermediate metal layer 42 are defined by the two walls 42*b* and the wick forming portion 42*c*. As described above, the flow passages 14*b* allow the working fluid C to readily flow through the liquid pipe 14.

The wick forming portion 42*t* of the intermediate metal layer 42 includes grooves 42*s*. Each groove 42*s* extends through the intermediate metal layer 42 in the thickness-wise direction. The grooves 42*s* extend parallel to each other in a given direction, for example, the longitudinal direction (sideward direction in FIGS. 1 and 3B) of the flat loop heat pipe 10. The grooves 42*s* extend in a direction (in the example of FIG. 3B, the direction orthogonal to the flow passage 13*r*) intersecting with the flow passage 42*r*, that is, the flow passage 13*r* of the condenser 13, in communication with the flow passage 13*r* (42*r*). The grooves 42*s* each have a width W1 that may be, for example, less than or equal to 0.8 mm. The width W1 of the groove 42*s* may be changed in accordance with, for example, the thickness and/or material of the intermediate metal layer 42.

FIG. 3C illustrates a portion of the intermediate metal layer 43. The intermediate metal layer 43 includes the flow passage 12*b* at a portion corresponding to the vapor pipe 12. The flow passage 12*b* of the intermediate metal layer 43 is defined by the two walls 43*a*. The intermediate metal layer 43 further includes a wick forming portion 43*t* and a flow passage 43*r* at a portion corresponding to the condenser 13. The wick forming portion 43*t* forms the wick 13*t*, and the flow passage 43*r* forms the flow passage 13*r*. The flow passage 43*r* is defined by the wick forming portion 43*t* and a wall 43*d*. The intermediate metal layer 43 further includes the wick forming portion 43*c* and the two flow passages 14*b* at a portion corresponding to the liquid pipe 14. The wick forming portion 43*c* forms the wick 14*t* (refer to FIG. 2). The flow passages 14*b* of the intermediate metal layer 43 are defined by the two walls 43*b* and the wick forming portion 43*c*. As described above, the flow passages 14*b* allow the working fluid C to readily flow through the liquid pipe 14.

The wick forming portion 43*t* of the intermediate metal layer 43 includes grooves 43*s*. Each groove 43*s* extends through the intermediate metal layer 43 in the thickness-wise direction. The grooves 43*s* extend parallel to each other in a given direction, for example, the lateral direction (vertical direction in FIGS. 1 and 3C) of the flat loop heat pipe 10. Thus, the grooves 42*s* and 43*s* of the intermediate metal layers 42 and 43, which are located adjacent to each other in the stack direction, extend orthogonal to each other in a plan view. In other words, the grooves 42*s* and 43*s* of the intermediate metal layers 42 and 43, which are located adjacent to each other in the stack direction, partially overlap with each other in communication with each other in a plan view. The grooves 43*s* are in communication with the flow passage 13*r* (43*r*) via the grooves 42*s* or in direct communication with the flow passage 13*r* (43*r*). Each groove 43*s* has a width W2 that may be, for example, less than or equal to 0.8 mm. However, the width W2 of the groove 43*s* may be changed in accordance with, for example, the thickness and/or material of the intermediate metal layer 43.

As described above, the intermediate metal layer 44 and the intermediate metal layer 42 have the same shape. Thus, as illustrated in FIGS. 3B, 4, and 5, in the same manner as the intermediate metal layer 42, the intermediate metal layer 44 includes the flow passage 12*b* (two walls 44*a*) at a portion corresponding to the vapor pipe 12 and a wick forming portion 44*t* and a flow passage 44*r* at a portion corresponding to the condenser 13. The wick forming portion 44*t* forms the wick 13*t*, and the flow passage 44*r* forms the flow passage 13*r*. The flow passage 44*r* is defined by the wick forming portion 44*t* and a wall 44*d*. The wick forming portion 44*t* includes grooves 44*s*, which are formed in the same manner as the grooves 42*s* of the wick forming portion 42*t*. The intermediate metal layer 44 further includes the wick forming portion 44*c* and the two flow passages 14*b* at a portion corresponding to the liquid pipe 14. The wick forming portion 44*c* forms the wick 14*t* (refer to FIG. 2). The flow passages 14*b* of the intermediate metal layer 44 are defined by the two walls 44*b* and the wick forming portion 44*c*.

As described above, the intermediate metal layer 45 and the intermediate metal layer 43 have the same shape. Thus, as illustrated in FIGS. 3B, 4, and 5, in the same manner as the intermediate metal layer 43, the intermediate metal layer 45 includes the flow passage 12*b* (two walls 45*a*) at a portion corresponding to the vapor pipe 12 and a wick forming portion 45*t* and a flow passage 45*r* at a portion corresponding to the condenser 13. The wick forming portion 45*t* forms the wick 13*t*, and the flow passage 45*r* forms the flow passage 13*r*. The flow passage 45*r* is defined by the wick forming portion 45*t* and a wall 45*d*. The wick forming portion 45*t* includes grooves 45*s*, which are formed in the same manner as the grooves 43*s* of the wick forming portion 43*t*. The intermediate metal layer 45 further includes the wick forming portion 45*c* and the two flow passages 14*b* at a portion corresponding to the liquid pipe 14. The wick forming portion 45*c* forms the wick 14*t* (refer to FIG. 2). The flow passages 14*b* of the intermediate metal layer 45 are defined by the two walls 45*b* and the wick forming portion 45*c*.

Thus, the wick 13t of the condenser 13 includes a flow passage having a three-dimensional structure and formed by the grooves 42s to 45s of the intermediate metal layers 42 to 45, which exclude the outermost metal layers 41 and 46. The flow passage of the wick 13t is in communication with the flow passage 13r of the condenser 13. Thus, the working fluid C that is liquefied in the flow passage 13r flows from the flow passage 13r into the wick 13t and is guided toward the liquid pipe 14 with the capillary force produced by the wick 13t.

A method for manufacturing the flat loop heat pipe 10 will now be described.

The metal layers 41 to 46 illustrated in FIGS. 3A to 3C are obtained by performing, for example, wet etching on copper layers having a thickness of, for example, 100 µm to have desired patterns.

Then, the uppermost metal layer 41 (refer to FIG. 3A), the intermediate metal layer 42 (refer to FIG. 3B), the intermediate metal layer 43 (refer to FIG. 3C), the intermediate metal layer 44 (refer to FIG. 3B), the intermediate metal layer 45 (refer to FIG. 3C), and the lowermost metal layer 46 (refer to FIG. 3A) are sequentially stacked to form a metal layer stack. While the metal layers 41 to 46 are heated at a predetermined temperature (e.g., 900° C.), the metal layers 41 to 46 are pressed to perform diffusion-bonding on the metal layers 41 to 46.

The flat loop heat pipe 10 including the metal layers 41 to 46 is bent at the bending position BP illustrated in FIG. 1. The bending position BP is set to the wick portion 13B of the condenser 13. The flat loop heat pipe 10 is bent at the wick portion 13B. The wick portion 13B includes the wick 13t. When the flat loop heat pipe 10 is bent, the wick 13t functions as a support bar. This hinders the condenser 13 from crushing during the bending and limits effects of the bending.

The mount configuration of the flat loop heat pipe 10 will now be described with reference to FIGS. 1 and 6.

As illustrated in FIG. 6, the flat loop heat pipe 10 is used, for example, in an electronic device 100.

The electronic device 100 includes a casing 101 and a wiring substrate 110 accommodated in the casing 101. The wiring substrate 110 is spaced apart from an inner surface 101a of the casing 101 by a support (not illustrated). The heat-generating component 111 is mounted on the upper surface of the wiring substrate 110. The heat-generating component 111 is, for example, a semiconductor device such as a central processing unit (CPU) or a graphics processing unit (GPU) or any electronic component that generates heat.

The flat loop heat pipe 10 is bent to be L-shaped. The evaporator 11 is arranged on the heat-generating component 111 to cool the heat-generating component 111. The condenser 13 of the flat loop heat pipe 10 is arranged along a side plate 102 of the casing 101 and fixed to an inner surface of the side plate 102 by a connection member 120. The connection member 120 may be, for example, a heat sink. This efficiently dissipates heat to the outside of the casing 101. Additionally, a thermal interface material (TIM) may be arranged in at least one of positions between the condenser 13 and the connection member 120 and between the connection member 120 and the side plate 102 of the casing 101. In such a case, heat is more smoothly transferred from the condenser 13 to the casing 101.

The condenser 13 includes the flow passage 13r and the wick 13t that is exposed in the flow passage 13r and in communication with the flow passage 13r. The vapor Cv flows from the vapor pipe 12 into the flow passage 13r of the condenser 13 and is liquefied. The capillary force produced by the wick 13t, which is exposed in the flow passage 13r, moves the liquefied working fluid C from the flow passage 13r into the wick 13t.

If the condenser 13 does not include the flow passage 13r, the area of the wick 13t exposed to the vapor Cv flowing through the vapor pipe 12 is small. This limits the vapor Cv entering the condenser 13 (the wick 13t). In this regard, the condenser 13 of the present embodiment includes the flow passage 13r that is in communication with the flow passage 12b of the vapor pipe 12. Thus, the vapor Cv flows from the vapor pipe 12 into the flow passage 13r. Additionally, the wick 13t is exposed in the flow passage 13r in the longitudinal direction of the flow passage 13r. This increases the area of the wick 13t exposed to the vapor Cv. Accordingly, the amount of the vapor Cv entering from the flow passage 13r into the wick 13t increases. This facilitates the flow of the vapor Cv to the condenser 13 and efficiently liquefies the vapor Cv in the condenser 13.

The wick 13t of the condenser 13 is connected to the wick 14t of the liquid pipe 14. Thus, the working fluid C flowing through the wick 13t moves to the wick 14t of the liquid pipe 14. The working fluid C is guided from the condenser 13 to the liquid pipe 14. This allows the working fluid C that is liquefied by the condenser 13 to readily flow to the liquid pipe 14.

The wick 14t of the liquid pipe 14 is configured to produce a greater capillary force on the working fluid C than the wick 13t of the condenser 13. This allows the working fluid C to readily move from the condenser 13 to the liquid pipe 14. The movement of the working fluid C from the wick 13t of the condenser 13 to the wick 14t of the liquid pipe 14 facilitates movement of the working fluid C from the flow passage 13r into the wick 13t exposed in the flow passage 13r.

The present embodiment has the advantages described below.

(1) The flat loop heat pipe 10 includes the evaporator 11 vaporizing the working fluid C, the condenser 13 liquefying the working fluid C (vapor Cv), the vapor pipe 12 connecting the evaporator 11 to the condenser 13, and the liquid pipe 14 connecting the condenser 13 to the evaporator 11. The liquid pipe 14 includes the wick 14t. The condenser 13 includes the flow passage portion 13A and the wick portion 13B. The flow passage portion 13A includes the flow passage 13r connecting the vapor pipe 12 and the liquid pipe 14. The wick portion 13B includes the wick 13t connected to the wick 14t. The wick 13t is exposed in the flow passage 13r and extends from the flow passage 13r in the planar direction of the flat loop heat pipe 10. With this configuration, the wick 13t exposed in the flow passage 13r increases the amount of the working fluid C or the vapor Cv entering from the flow passage 13r into the wick 13t that is in communication with the flow passage 13r. Additionally, the wick 13t is connected to the wick 14t so that the working fluid C flows from the wick 13t to the wick 14t. This maintains a smooth flow of the working fluid C from the condenser 13 to the liquid pipe 14. As a result, the vapor pipe 12 efficiently liquefies the vapor Cv, thereby improving the cooling effect.

(2) The bending position BP is set in the wick portion 13B, and the flat loop heat pipe 10 is bent at the bending position BP. When the flat loop heat pipe 10 is bent, the wick 13t of the wick portion 13B functions as a support bar. This hinders the condenser 13 from crushing during the bending and limits effects of the bending. Thus, the flow passage 21 of the working fluid C is appropriately maintained in the condenser 13.

(3) The liquefied working fluid C flows from the flow passage 13r of the condenser 13 into the wick 13t and is guided to the liquid pipe 14 with the capillary force produced by the wick 13t. Thus, the working fluid C that is liquefied by the condenser 13 readily flows to the liquid pipe 14.

(4) The wick 14t of the liquid pipe 14 is configured to produce a greater capillary force on the working fluid C than the wick 13t of the condenser 13. This allows the working fluid C to readily move from the condenser 13 to the liquid pipe 14.

It should be apparent to those skilled in the art that the foregoing embodiments may be implemented in many other specific forms without departing from the scope of this disclosure. Particularly, it should be understood that the foregoing embodiments may be implemented in the following forms.

The configuration of the wick 13t included in the wick portion 13B of the condenser 13 may be changed.

Figure 7A:
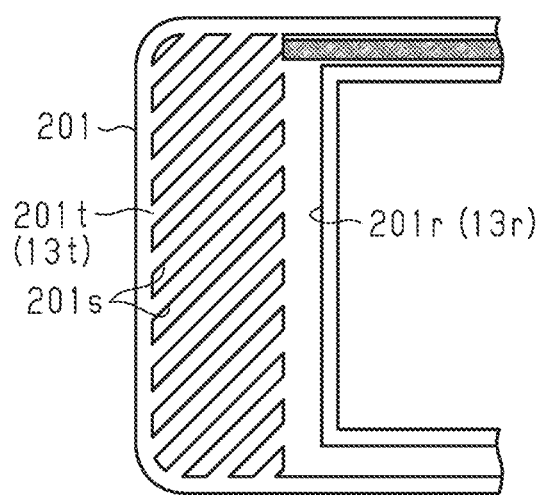
FIGS. 7A and 7B are each a schematic plan view illustrating a portion of an intermediate metal layer forming a modified example of a flat loop heat pipe.
Figure 7B:
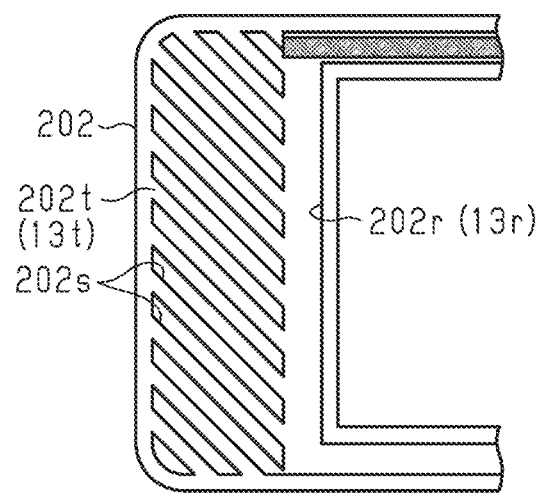

FIGS. 7A and 7B are each a partially schematic plan view of intermediate metal layers 201 and 202 forming a modified example of the wick 13t. For example, the intermediate metal layers 201 and 202 may be used instead of the intermediate metal layers 42 to 46 of the above embodiment. The number of layers in the intermediate metal layers 201 and 202 is not particularly limited.

As illustrated in FIG. 7A, the intermediate metal layer 201 includes a wick forming portion 201t and a flow passage 201r at a portion corresponding to the condenser 13. The wick forming portion 201t forms the wick 13t. The flow passage 201r forms the flow passage 13r. The wick forming portion 201t includes grooves 201s obliquely extending relative to the flow passage 201r.

As illustrated in FIG. 7B, the intermediate metal layer 202 includes a wick forming portion 202t and a flow passage 202r at a portion corresponding to the condenser 13. The wick forming portion 202t forms the wick 13t. The flow passage 202r forms the flow passage 13r. The wick forming portion 202t includes grooves 202s obliquely extending relative to the flow passage 202r in a direction (e.g., direction orthogonal to grooves 201s) intersecting with the grooves 201s of the intermediate metal layer 201 in a plan view. The intermediate metal layers 201 and 202 having such configurations are stacked between the outermost metal layers 41 and 46 of the above embodiment to form a flat loop heat pipe. Even with such a configuration of the wick 13t, the working fluid C readily moves from the flow passage 13r (201r, 202r) into the wick 13t.

Figure 8:
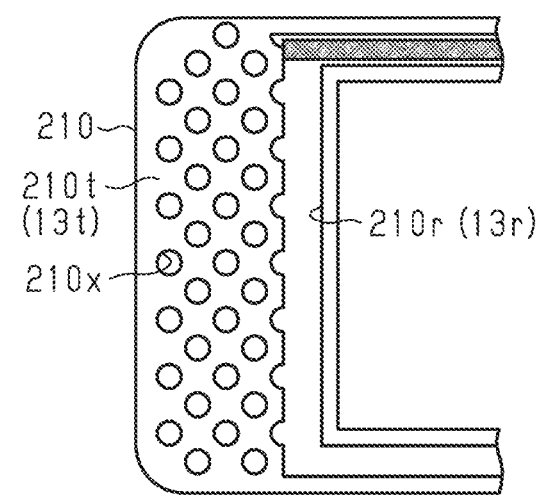
FIG. 8 is a schematic plan view illustrating a portion of an intermediate metal layer forming another modified example of a flat loop heat pipe.

FIG. 8 illustrates a schematic cross-sectional view of a portion of an intermediate metal layer 210 forming another modified example of the wick 13t. For example, multiple intermediate metal layers 210 may be used instead of the intermediate metal layers 42 to 46 of the above embodiment.

As illustrated in FIG. 8, the intermediate metal layer 210 includes a wick forming portion 210t and a flow passage 210r at a portion corresponding to the condenser 13. The wick forming portion 210t forms the wick 13t. The flow passage 210r forms the flow passage 13r. The wick forming portion 210t includes through holes 210x extending through the intermediate metal layer 210 in the thickness-wise direction. The through holes 210x differ from each other in formation position and size between the intermediate metal layers 210 that are adjacent to each other in the stack direction so that the through holes 210x in the adjacent ones of the intermediate metal layers 210 partially overlap with each other. When the metal layers 210 formed as described above are stacked between the outermost metal layers 41 and 46 of the above embodiment, the wick portion 13B of the condenser 13 includes the wick 13t including a fine flow passage as in the wick 14t illustrated in FIG. 5.

Figure 9A:
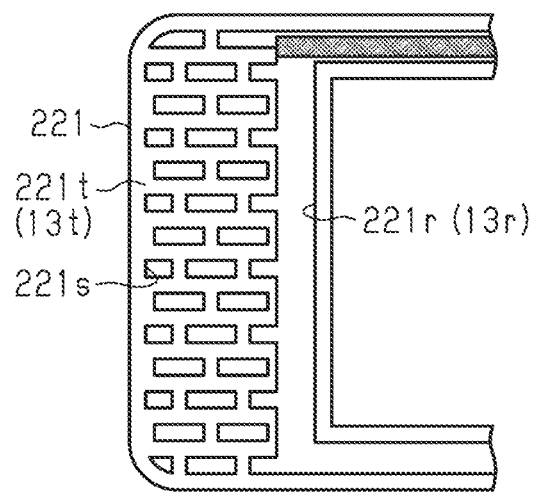
FIGS. 9A and 9B are each a schematic plan view illustrating a portion of an intermediate metal layer forming another modified example of a flat loop heat pipe.
Figure 9B:
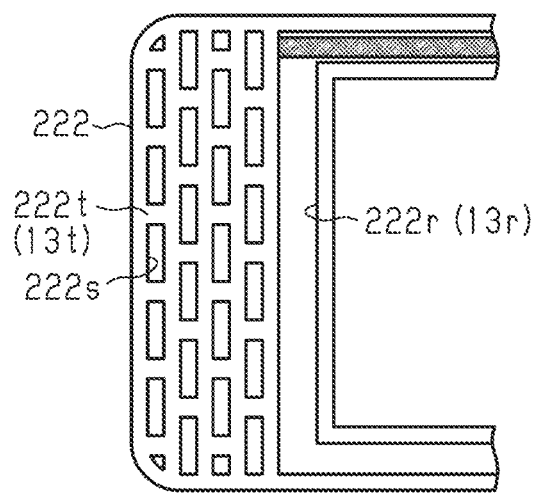

FIGS. 9A and 9B are partially schematic plan views of intermediate metal layers 221 and 222 forming another modified example of the wick 13t. For example, the intermediate metal layers 221 and 222 may be used instead of the intermediate metal layers 42 to 46 of the above embodiment. The number of layers in the intermediate metal layers 221 and 222 is not particularly limited.

As illustrated in FIG. 9A, the intermediate metal layer 221 includes a wick forming portion 221t and a flow passage 221r at a portion corresponding to the condenser 13. The wick forming portion 221t forms the wick 13t. The flow passage 221r forms the flow passage 13r. The wick forming portion 221t includes grooves 221s extending in a direction orthogonal to the flow passage 221r. The grooves 221s are arranged in rows in a direction parallel to the flow passage 221r (i.e., vertical direction in FIG. 9A) and in columns in a direction orthogonal to the flow passage 221r (i.e., lateral direction in FIG. 9A). Each groove 221s in each row is located between the grooves 221s in adjacent rows so that the grooves 221s of the wick forming portion 221t are arranged in a staggered manner in a plan view.

A illustrated in FIG. 9B, the intermediate metal layer 222 includes a wick forming portion 222t and a flow passage 222r at a portion corresponding to the condenser 13. The wick forming portion 222t forms the wick 13t. The flow passage 222r forms the flow passage 13r. The wick forming portion 222t includes grooves 222s extending parallel to the flow passage 222r. The grooves 222s are arranged rows in a direction parallel to the flow passage 222r (i.e., vertical direction in FIG. 9B) and in columns in a direction orthogonal to the flow passage 222r (i.e., lateral direction in FIG. 9B). (i.e., lateral direction in FIG. 9A). Each groove 222s in each column is located between the grooves 222s in adjacent columns so that the grooves 222s of the wick forming portion 222t are arranged in a staggered manner in a plan view. The intermediate metal layers 221 and 222 formed as described above are stacked between the outermost metal layers 41 and 46 of the above embodiment to form a flat loop heat pipe. Even with such a configuration of the wick 13t, the working fluid C readily moves from the flow passage 13r (221r, 222r) into the wick 13t.

In the embodiment and the modified examples, the grooves of the wick forming portions extend orthogonal to each other in a plan view between the intermediate metal layers that are adjacent to each other in the stack direction. Instead, the grooves may intersect with each other at arcuate angles between the adjacent intermediate metal layers. Alternatively, the grooves may extend parallel to each other between the adjacent intermediate metal layers as long as the grooves partially overlap in communication with each other between the adjacent intermediate metal layers. Such configurations also obtain the same advantages as those of the embodiment.

In the embodiment, as illustrated in FIG. 6, the flat loop heat pipe 10 is orthogonally bent at the bending position BP (refer to FIG. 1). However, any bending angle may be used. Further, the condenser 13 may be curved and arc-shaped.

In the embodiment, the width W1 of the groove 42s and the width W2 of the groove 43s may be changed. The width W1 of the groove 42s and the width W2 of the groove 43s may be set to different values.

The embodiment and the modified examples may be partially replaced with appropriate known configurations.

Also, the embodiment and the modified examples may be partially or entirely combined with other modes or other modified examples.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A flat loop heat pipe, comprising
   an evaporator that vaporizes a working fluid;
   a condenser that liquefies the working fluid vaporized by the evaporator;
   a vapor pipe that connects the evaporator to the condenser; and
   a liquid pipe that connects the condenser to the evaporator and includes a first wick, wherein
   the vapor pipe includes a first wall and a second wall, the second wall being spaced apart from and facing the first wall,
   the liquid pipe includes a third wall and a fourth wall, the fourth wall being spaced apart from and facing the third wall,
   the condenser includes
      a flow passage that connects the vapor pipe and the liquid pipe,
      a second wick connected to the first wick,
      a fifth wall connecting the first wall of the vapor pipe and the third wall of the liquid pipe,
      a sixth wall extending from the second wall of the vapor pipe,
      a seventh wall extending from the fourth wall of the liquid pipe, and
      an eighth wall spaced apart from and facing the fifth wall, the eighth wall connecting the sixth wall and the seventh wall, wherein
      the second wick is formed integrally with the sixth wall, the seventh wall, and the eighth wall,
      the second wick includes an end portion spaced apart from and facing the fifth wall,
      the flow passage of the condenser is defined by the end portion of the second wick and the fifth wall of the condenser and is formed along the fifth wall of the condenser, and
      the fifth wall of the condenser is free from the first wick and the second wick.

2. The flat loop heat pipe according to claim 1, wherein the second wick is exposed in the flow passage along a direction in which the flow passage extends from the vapor pipe to the liquid pipe.

3. The flat loop heat pipe according to claim 1, wherein the condenser is bent at a position of the second wick.

4. The flat loop heat pipe according to claim 1, wherein the evaporator, the vapor pipe, the condenser, and the liquid pipe are formed by two outermost metal layers and a plurality of intermediate metal layers stacked between the two outermost metal layers.

5. The flat loop heat pipe according to claim 4, wherein the second wick includes a plurality of grooves formed in adjacent intermediate metal layers of the plurality of intermediate metal layers, and
   the plurality of grooves extend in a direction intersecting with each other in a plan view between the adjacent intermediate metal layers to partially overlap with each other between the adjacent intermediate metal layers.

6. The flat loop heat pipe according to claim 5, wherein the plurality of grooves include:
   a plurality of first grooves formed in a first intermediate metal layer of the adjacent intermediate metal layers and extending in a direction intersecting with the flow passage; and
   a plurality of second grooves formed in a second intermediate metal layer of the adjacent intermediate metal layers and extending in a direction intersecting with the direction in which the plurality of first grooves extend so that the plurality of second grooves partially overlap with the plurality of first grooves.

* * * * *